United States Patent
Nakanishi et al.

(10) Patent No.: US 8,445,360 B2
(45) Date of Patent: May 21, 2013

(54) METHOD FOR MANUFACTURING SEMICONDUCTOR DEVICE

(75) Inventors: Masayuki Nakanishi, Tokyo (JP); Tetsuji Togawa, Tokyo (JP); Kenya Ito, Tokyo (JP); Masaya Seki, Tokyo (JP); Kenji Iwade, Hiratsuka (JP); Takeo Kubota, Kuwana (JP)

(73) Assignees: Ebara Corporation, Tokyo (JP); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/027,551

(22) Filed: Feb. 15, 2011

(65) Prior Publication Data

US 2011/0207294 A1    Aug. 25, 2011

(30) Foreign Application Priority Data

Feb. 22, 2010    (JP) ................................ 2010-036114

(51) Int. Cl.
| | |
|---|---|
| *H01L 21/46* | (2006.01) |
| *H01L 21/30* | (2006.01) |
| *H01L 21/78* | (2006.01) |
| *H01L 21/301* | (2006.01) |

(52) U.S. Cl.
USPC ........... 438/459; 438/458; 438/460; 438/464; 438/692; 257/E21.567; 257/E21.23; 257/E21.237; 257/E21.502; 257/E21.583; 451/41; 451/44; 451/59

(58) Field of Classification Search
USPC .......................... 257/E21.567; 451/41, 44, 59
See application file for complete search history.

(56) References Cited

U.S. PATENT DOCUMENTS

| 6,140,254 A * | 10/2000 | Endisch et al. ............... 438/787 |
| 6,583,029 B2 | 6/2003 | Abe et al. |
| 7,919,394 B2 * | 4/2011 | Nakamura et al. ............ 438/459 |
| 2002/0160610 A1 * | 10/2002 | Arai et al. ...................... 438/692 |
| 2006/0068684 A1 * | 3/2006 | Kubota ............................ 451/5 |
| 2007/0264822 A1 * | 11/2007 | Kubota et al. ................. 438/660 |
| 2008/0254719 A1 | 10/2008 | Shigeta et al. |

(Continued)

FOREIGN PATENT DOCUMENTS

| JP | 4-85827 | 3/1992 |
| JP | 4-263425 | 9/1992 |

(Continued)

OTHER PUBLICATIONS

Nakanishi et al., English Machine Translated of JP Publication No. 2010-162624, Jul. 29, 2010; (Machine Translated Jun. 4, 2012).*

*Primary Examiner* — Mohsen Ahmadi
(74) *Attorney, Agent, or Firm* — Wenderoth, Lind & Ponack, L.L.P.

(57) ABSTRACT

A method for manufacturing a semiconductor device makes it possible to efficiently polish with a polishing tape a peripheral portion of a silicon substrate under polishing conditions particularly suited for a deposited film and for silicon underlying the deposited film. The method includes pressing a first polishing tape against a peripheral portion of a device substrate having a deposited film on a silicon surface while rotating the device substrate at a first rotational speed, thereby removing the deposited film lying in the peripheral portion of the device substrate and exposing the underlying silicon. A second polishing tape is pressed against the exposed silicon lying in the peripheral portion of the device substrate while rotating the device substrate at a second rotational speed, thereby polishing the silicon to a predetermined depth.

6 Claims, 10 Drawing Sheets

U.S. PATENT DOCUMENTS

| | | |
|---|---|---|
| 2008/0293340 A1 * | 11/2008 | Kollata et al. ............. 451/285 |
| 2009/0142992 A1 | 6/2009 | Takahashi et al. |
| 2009/0227189 A1 | 9/2009 | Maeda et al. |
| 2010/0178851 A1 | 7/2010 | Nakanishi et al. |

FOREIGN PATENT DOCUMENTS

| | | |
|---|---|---|
| JP | 8-192360 | 7/1996 |
| JP | 2001-345435 | 12/2001 |
| JP | 2003-257917 | 9/2003 |
| JP | 2007-5661 | 1/2007 |
| JP | 2008-263027 | 10/2008 |
| JP | 2009-154285 | 7/2009 |
| JP | 2009-208214 | 9/2009 |
| JP | 2010-162624 | 7/2010 |

* cited by examiner

Positions for Measurement

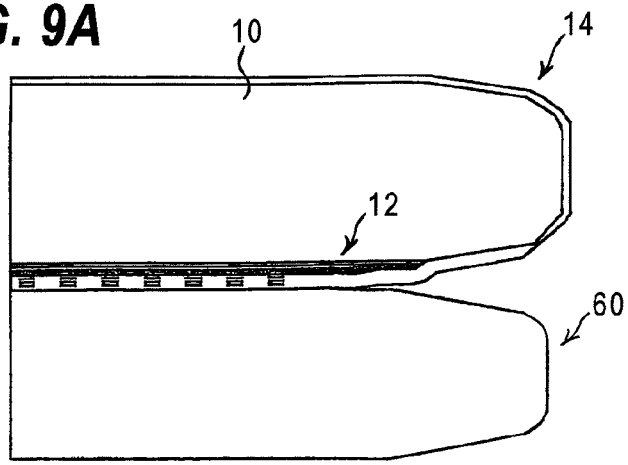
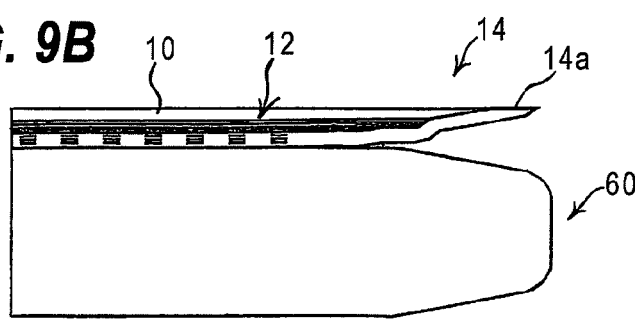
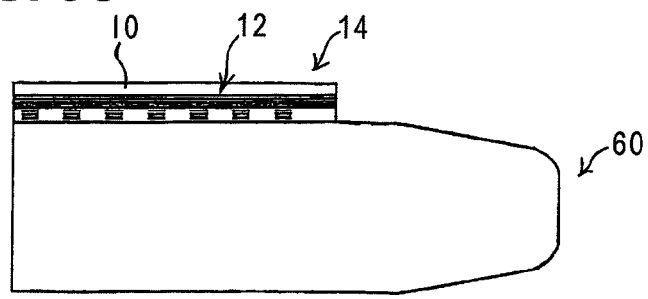

METHOD FOR MANUFACTURING SEMICONDUCTOR DEVICE

BACKGROUND OF THE INVENTION

1. Field of the Invention

The present invention relates to a method for manufacturing a semiconductor device, and more particularly to a method for use in the manufacturing of an SOI (silicon-on-insulator) substrate by a bonding method which involves bonding, through heat treatment or the like, two silicon substrates: a device substrate having semiconductor devices, and a supporting substrate.

2. Description of the Related Art

A bonding method, which involves bonding, through heat treatment or the like, two silicon substrates (a device substrate and a supporting substrate), is known as a method for manufacturing an SOI substrate. When manufacturing an SOI substrate by such a boding method, it is necessary to remove a peripheral non-bonded portion of bonded two substrates from the SOI substrate.

A method is known in which a first silicon substrate (device substrate), having a semiconductor layer (SIO layer) in a surface and whose peripheral portion of the surface has been polished away, and a second silicon substrate (supporting substrate), facing each other, are bonded via an insulting film, and then aback surface of the first silicon substrate (device substrate) is removed by polishing or etching, leaving the semiconductor layer (see Japanese Patent Laid-Open Publication No. H4-85827). The polishing of the peripheral portion of the surface of the silicon wafer having the semiconductor layer (SIO layer) can be carried out, e.g., with a grinding stone (see Japanese Patent Laid-Open Publication No. H4-263425).

A method is also known in which a first silicon substrate (device substrate), having a surface semiconductor layer (SIO layer), and a second silicon substrate (supporting substrate), facing each other, are bonded via an oxide film. A thickness of the first silicon substrate (device substrate) is then reduced to a predetermined thickness, leaving the semiconductor layer (SIO layer). Thereafter, a peripheral portion of the semiconductor layer (SIO layer) of the first silicon substrate (device substrate) is chamfered (see Japanese Patent Laid-Open Publication No. 2001-345435). The chamfering of the peripheral portion of the semiconductor layer is performed, e.g., by tape polishing or soft polishing.

A method for polishing a peripheral portion of a silicon substrate has been proposed. This method comprises polishing an insulating film with a polishing tape, having ceria abrasive particles fixed on it, until a silicon surface becomes exposed, and continuing polishing with a polishing tape having diamond abrasive particles which have a higher ability to polish silicon than ceria abrasive particles (see Japanese Patent Laid-Open Publication No. 2008-263027).

The applicant has proposed a polishing apparatus which can polish a peripheral portion of a substrate, including the flat portion, with a polishing tape while maintaining the original angle of the peripheral portion (see Japanese Patent Laid-Open Publication No. 2009-208214).

Removal of a deposited film (insulating film) and polishing of silicon in a peripheral portion of a silicon substrate are generally carried out by using a diamond disk. When carrying out such polishing with a diamond disk, it is necessary to accurately control the position of the polishing machine itself. The positional control of such a polishing machine is fairly cumbersome. Further, a surface of a deposited film, e.g., covering device interconnects, of a silicon substrate is likely to be stained. In addition, when a high contact pressure of a diamond disk on a silicon substrate is used in order to ensure an appropriately high polishing rate, the large pressure can cause significant damage, such as crack, to the silicon substrate. The use of a low contact pressure to prevent this problem will lead to a considerably low removal rate for a deposited film and silicon.

When a grinding stone is used to polish away a deposited film (insulating film) and silicon from a peripheral portion of a silicon substrate, it is necessary to position the grinding stone at a slight distance from, e.g., a supporting substrate so as to avoid contact with the silicon substrate. This requires high-precision positioning of the grinding stone and necessitates a special structure for that, making the apparatus construction complicated.

On the other hand, when the removal of a deposited film and polishing of silicon in a peripheral portion of a silicon substrate are carried out successively using one polishing tape, the degree of polishing of silicon can differ according to location, producing irregularities in the polished surface. In particular, in a silicon substrate having interconnects, a peripheral area where a deposited film needs to be polished away is changeable, and a thickness of the deposited film often varies according to location along the circumferential direction of the silicon substrate. Such a deposited film, in a thin portion, may be removed quickly, but it may take a considerably longer time to polish away a thick portion of the deposited film. When the polishing rate of silicon is higher than the polishing rate of the deposited film, silicon will be polished away in a considerably larger amount in those areas where the deposited film has been removed quickly. Thus, the polishing amount of silicon is likely to vary according to location in the silicon substrate.

Further, it is difficult and requires long-time polishing to control the surface roughness of a polished surface or to remove a damaged or crushed layer remaining on a polished surface. Insufficient control of the configuration or surface roughness of a polished surface will lead to difficulty in the next-step processing, such as film forming.

SUMMARY OF THE INVENTION

The present invention has been made in view of the above situation. It is therefore an object of the present invention to provide a method for manufacturing a semiconductor device, which makes it possible to efficiently polish with a polishing tape a peripheral portion of a silicon substrate under polishing conditions particularly suited for a deposited film and for silicon underlying the deposited film.

In order to achieve the above object, the present invention provides a method for manufacturing a semiconductor device comprising: pressing a first polishing tape against a peripheral portion of a device substrate having a deposited film on a silicon surface while rotating the device substrate at a first rotational speed, thereby removing the deposited film lying in the peripheral portion of the device substrate and exposing the underlying silicon; and pressing a second polishing tape against the exposed silicon lying in the peripheral portion of the device substrate while rotating the device substrate at a second rotational speed, thereby polishing the silicon to a predetermined depth.

By thus carrying out polishing of a peripheral portion of a silicon substrate (removal of a deposited film and polishing of silicon) by using a polishing tape, the polishing tape is allowed to make soft contact with the silicon substrate and the pressure of the polishing tape on the silicon substrate can be easily controlled as compared to the case where the silicon substrate is polishing by using a diamond disk. Further, the use of a polishing tape makes it possible to polish a silicon substrate in a wet environment. For example, polishing of a silicon substrate can be carried out while covering a surface of a deposited film, covering device interconnects, with water. Such wet polishing can prevent foreign matter or contaminants from adhering to a surface of a deposited film. According to the method of the present invention, the removal of a deposited film and the polishing of silicon are carried out under different polishing conditions, and the deposited film is completely removed under polishing conditions suited for the removal of the deposited film. This makes it possible to prevent variation in the polishing amount of silicon according to location and to easily control the polishing amount while polishing silicon at a high polishing rate. In addition, it becomes possible for the silicon polishing to remove a damaged or crushed layer from a surface being polished and control the surface roughness of a polished surface.

In a preferred aspect of the present invention, the first rotational speed is 100 to 400 rpm, and the second rotational speed is not less than 500 rpm.

The polishing selectivity for silicon (difference in polishing rate between silicon and deposited film) can be made low by rotating a silicon substrate at a rotational speed of 100 to 400 rpm during the removal of a deposited film. This makes it possible to mainly remove the deposited film while less polishing silicon when there is variation in the thickness of the deposited film in the substrate surface. After completely removing the deposited film, silicon can be polished at a high rate by rotating the silicon substrate at a rotational speed of not less than 500 rpm during polishing of silicon.

In a preferred aspect of the present invention, the first polishing tape is a diamond tape having #2000 or less diamond abrasive particles or ceria tape having ceria abrasive particles, and the second polishing tape is a diamond tape having #4000-#20000 diamond abrasive particles.

The polishing selectivity for silicon (difference in polishing rate between silicon and deposited film) can be made low by removing the deposited film with a diamond tape having #2000 or less diamond abrasive particles or ceria tape having ceria abrasive particles. This makes it possible to mainly remove the deposited film while less polishing silicon when there is variation in the thickness of the deposited film in the substrate surface. After completely removing the deposited film, the silicon polishing rate can be increased by polishing silicon with a diamond tape having #4000-#20000 diamond abrasive particles. Further, such silicon polishing can appropriately adjust the surface roughness of a polished surface and can remove a damaged or crushed layer remaining on a surface being polished.

In a preferred aspect of the present invention, the method for manufacturing a semiconductor device, further comprises: bonding a supporting substrate to the surface of the device substrate after polishing the silicon to a predetermined depth; grinding silicon on the back side of the device substrate until a predetermined thickness of the device substrate is reached; and then pressing a third polishing tape against a peripheral portion of the supporting substrate while rotating the bonded substrates at a third rotational speed, thereby polishing silicon, lying in the peripheral portion of the supporting substrate, to a predetermined depth to form a chamfered portion.

By thus forming a chamfered portion in the peripheral portion of the supporting substrate, the device substrate can be prevented from peeling off the supporting substrate and breaking.

In a preferred aspect of the present invention, the method for manufacturing a semiconductor device, further comprises: pressing a fourth polishing tape against the chamfered portion formed in the peripheral portion of the supporting substrate while rotating the bonded substrates at a fourth rotational speed to carry out finish polishing of the chamfered portion.

By thus carrying out the finish polishing of the chamfered portion, a resist, for example, can be prevented from remaining on the chamfered portion and adversely affecting a later process.

The present invention also provides a method for manufacturing a semiconductor device comprising: bonding a supporting substrate to a surface of a device substrate having in the surface a deposited film on a silicon surface; grinding silicon on the back side of the device substrate until a predetermined thickness of the device substrate is reached; pressing a first polishing tape against a peripheral portion of the device substrate while rotating the bonded substrates at a first rotational speed, thereby removing the deposited film lying in the peripheral portion of the device substrate; and pressing a second polishing tape against a peripheral portion of the supporting substrate while rotating the bonded substrates at a second rotational speed, thereby polishing silicon, lying in the peripheral portion of the supporting substrate, to a predetermined depth to form a chamfered portion.

According to the present invention, the removal of a deposited film and polishing of silicon in a peripheral portion of a device substrate are carried out by using a polishing tape. Compared to the use of a diamond disk or the like, the use of a polishing tape allows the tape to make soft contact with a polishing object, preventing a crack or defect in a device substrate. Further, the use of a polishing tape makes it possible to polish a silicon substrate in a wet environment. For example, polishing of a device substrate can be carried out while covering a surface of a deposited film, covering device interconnects, with water. Such wet polishing can prevent foreign matter or contaminants from adhering to a surface of a deposited film. In the case of polishing with the use of a diamond disk, fall or wear of diamond abrasive particles will occur during long-term use of the diamond disk. In the case of polishing with the use of a polishing tape, on the other hand, the polishing tape is fed continuously during polishing. Thus, a constant polishing rate can be ensured and, in addition, there is no concern for fall or wear of diamond abrasive particles.

Further, according to the present invention, the removal of a deposited film and polishing of silicon are carried out under different polishing conditions, and the deposited film is completely removed under polishing conditions suited for the removal of the deposited film. This makes it possible to prevent variation in the polishing amount of silicon according to location and to easily control the amount of silicon while polishing silicon at a high polishing rate. In addition, it becomes possible for the silicon polishing to remove a damaged or crushed layer from a surface being polished and control the surface roughness of a polished surface.

BRIEF DESCRIPTION OF THE DRAWINGS

FIGS. 9A through 9C are diagrams illustrating a process according to another embodiment of the present invention.

DETAILED DESCRIPTION OF THE PREFERRED EMBODIMENTS

Preferred embodiments of the present invention will now be described in detail with reference to the drawings.

Figure 1A:
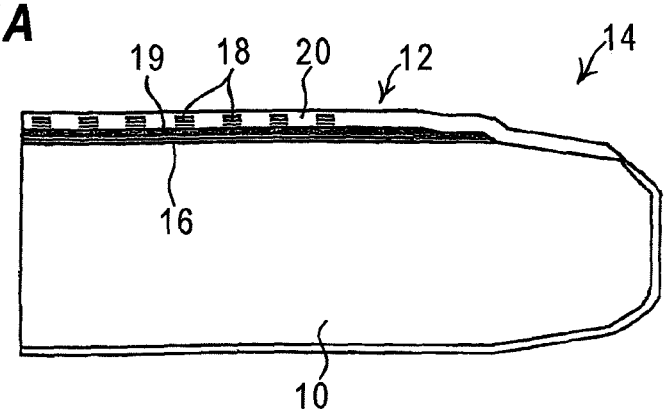
FIGS. 1A through 1C are diagrams illustrating a process according to an embodiment of the present invention, showing the process from the start to the step of polishing silicon of a device substrate.

First, as shown in FIG. 1A, a device substrate (silicon substrate) 14, having a deposited film 12, such as an interconnect film, on a surface of silicon (bare silicon) 10, is prepared. In this embodiment, the deposited film (interconnect film) 12 consists of a silicon layer 16, an oxide film 20 that covers device interconnects 18 formed on the surface of the silicon layer 16, and a nitride film (SiN film) 19 formed between the silicon layer 16 and the oxide film 20.

Figure 1B:
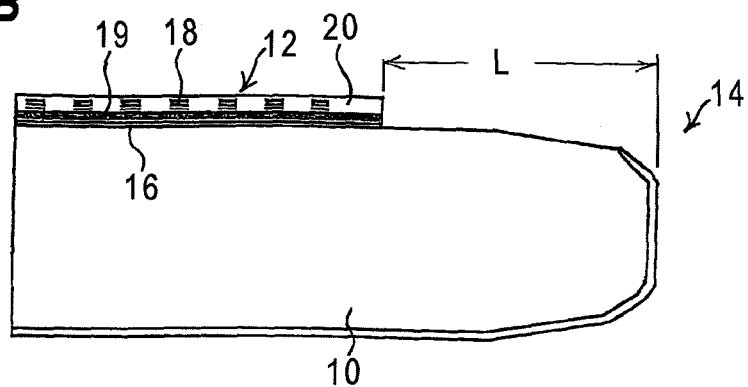
Figure 2:
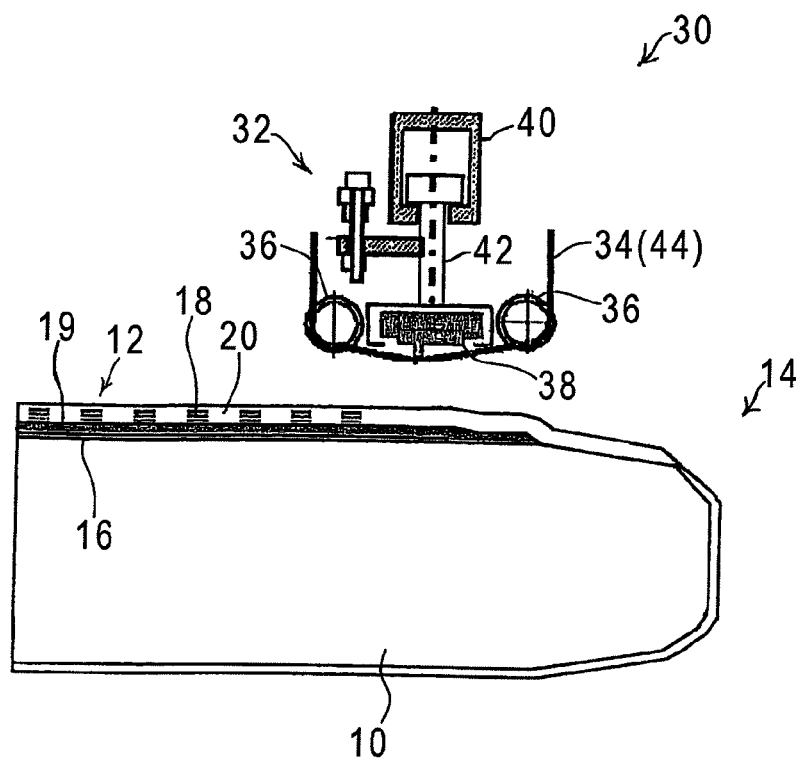
FIG. 2 is a diagram illustrating removal (polishing) of a deposited film of the device substrate, carried out according to the present invention.

Next, as shown in FIG. 1B, the deposited film 12, lying in the width L peripheral portion of the device substrate 14, is removed to expose the silicon 10 in the peripheral portion of the device substrate 14. The width L is, for example, 0.3 to 80 mm. The removal of the deposited film 12 is carried out, e.g., by using a polishing apparatus 30 as shown in FIG. 2. The polishing apparatus 30 includes a substrate holder (not shown) for holding and rotating the device substrate 14 with its front surface (device surface) facing upwardly, and a polishing head 32 disposed above the substrate holder. The polishing head 32 includes a pair of rolls 36 that moves a polishing tape 34 in one direction, and a pressing pad 38, located at the back of the polishing tape 34 that travels between the rolls 36, for pressing the polishing tape 34 against the device substrate 14. The polishing pad 38 is coupled to a lower end of a piston rod 42 of a press cylinder 40.

When removing the deposited film 12 lying in the peripheral portion of the device substrate 14 by using the polishing apparatus 30, the polishing head 32 is moved to a position from which polishing is intended to be started while holding and rotating the device substrate 14 with the front surface (device surface) facing upwardly by the substrate holder. While allowing the polishing tape 34 to travel at a constant speed, the pressing pad 38 is lowered to press the polishing tape 34 against the device substrate 14 at a set pressure, and the polishing head 32 is moved to the edge of the device substrate 14. In this manner, the polishing distance can be arbitrarily changed. The polishing operation is terminated when the deposited film 12, lying in the peripheral portion of the device substrate 14, is completely removed. During this polishing, the device substrate 14 may be kept in a wet environment, e.g., with pure water to protect the surface (device surface) of the device substrate 14 from dust.

The completion of polishing can be determined by using an end point detection system mounted in the polishing apparatus 30 and having, e.g., a measuring device which performs optical measurement (color discrimination with a CCD, laser light, white light), or measurement with microwaves, ultrasonic waves, alternating magnetic field signals, etc., or having a torque detector which detects the rotary torque of the substrate holder when it holds and rotates the device substrate 14.

When using an end point detection system having an optical measuring device, the measuring device is mounted to the polishing head 32 at its portion where the device substrate 14 after polishing can be monitored, and the end point detection system automatically determines whether polishing is completed or not, and automatically issues a command to proceed to the next step. In the case of an end point detection system having a torque detector which detects the rotary torque of the substrate holder, the detection system detects the rotary torque of the substrate holder during polishing continually, and automatically determines the completion of polishing by detecting a difference in the rotary torque due to change of the polishing object.

A measuring device for monitoring the end point of polishing may be mounted to the side of the polishing head 32 so that the device substrate 14 after polishing can be directly monitored, or mounted in the polishing head 32 at a position where the device substrate 14 can be monitored from the back of the polishing tape 34.

A space between a measuring device for monitoring the end point of polishing and the device substrate 14 may possibly be filled with a fluid (e.g., water), clean air or a transparent solid. It is preferred not to allow air bubbles or other obstacles to intervene between the device substrate 14 and the measuring device.

The traveling speed of the polishing tape 34 during the polishing is, for example, 1 to 50 mm/min, and the pressure of the polishing tape 34 on the device substrate 14 is, for example, 5 to 20 N. The rotational speed of the device substrate 14 is 100 to 400 rpm. A diamond tape 44 having #2000 or less diamond abrasive particles (particle size: not less than 9 μm) fixed on it is used as the polishing tape 34.

Figure 3:
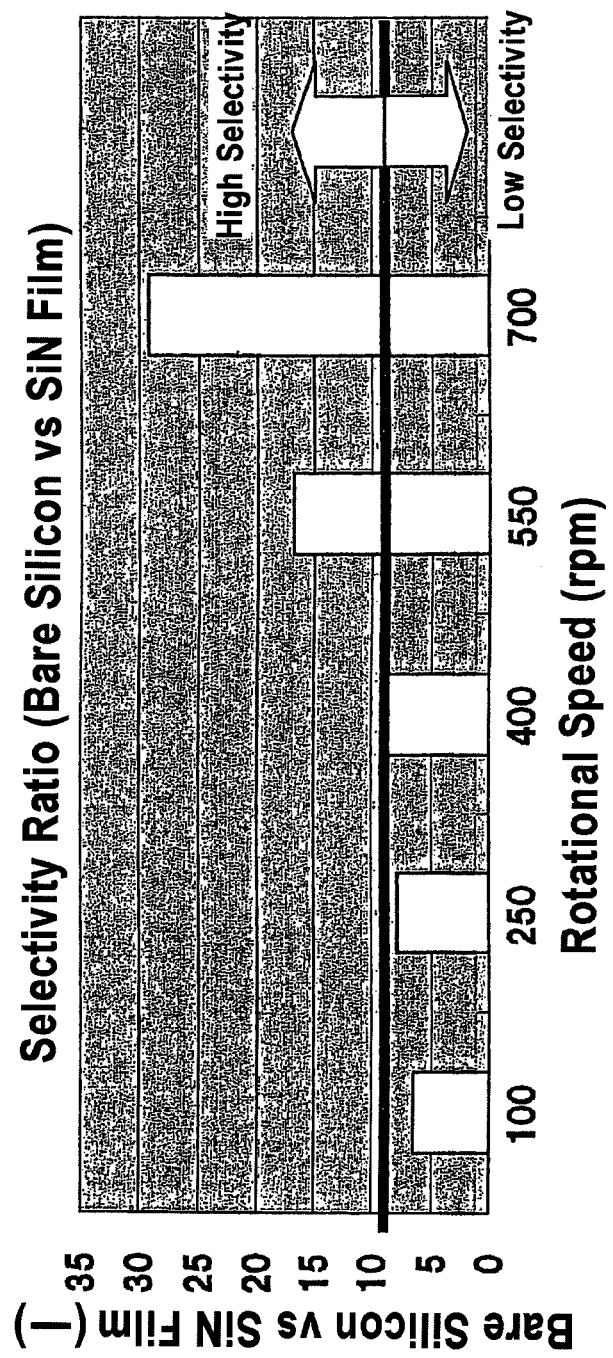
FIG. 3 is a graph showing the polishing rate ratio (selectivity ratio) between bare silicon and an SiN film in a silicon substrate in relation to the rotational speed of the silicon substrate, as measured when the silicon substrate is polished with a diamond tape, having #2000 diamond abrasive particles, while rotating the substrate at varying rotational speeds.

The rotational speed of the device substrate 14 is set at 100 to 400 rpm and the diamond tape 44 having #2000 or less diamond abrasive particles is used as the polishing tape 34 for the following reasons:

FIG. 3 shows the polishing rate ratio (selectivity ratio) between bare silicon and an SiN film in a silicon substrate in relation to the rotational speed of the substrate, as measured when the silicon substrate is polished with a diamond tape, having #2000 diamond abrasive particles, as the polishing tape 34 while rotating the substrate at varying rotational speeds in the polishing apparatus shown in FIG. 2. As can be seen from FIG. 3, the polishing selectivity (difference in polishing rate between bare silicon and an SiN film) increases with increase in the substrate rotational speed, and the selectivity ratio between bare silicon and an SiN film can be made not more than about 8 by using a substrate rotational speed of not more than 400 rpm. The data in FIG. 3 thus indicates that when there is variation in the thickness of the deposited film 12 in the device substrate 14, the deposited film 12, lying in the peripheral portion of the device substrate 14, can be completely removed without polishing silicon (bare silicon) 10 in a very large amount by carrying out polishing of the deposited film 12 while rotating the device substrate 14 at a rotational speed of 100 to 400 rpm.

Figure 4A:
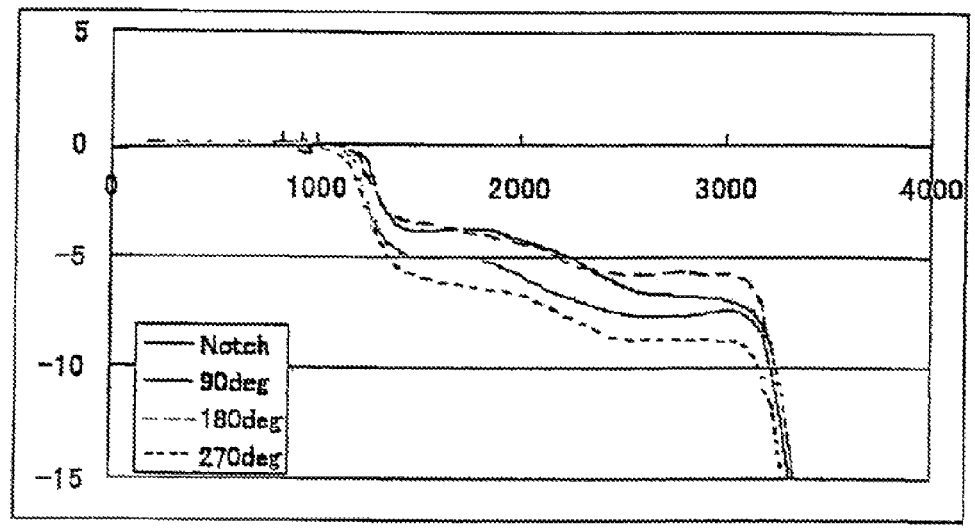
FIG. 4A is a graph showing the polishing amount of a device substrate at varying circumferential positions, as measured when the peripheral portion of the device substrate is polished while rotating the substrate at 700 rpm.
Figure 4B:
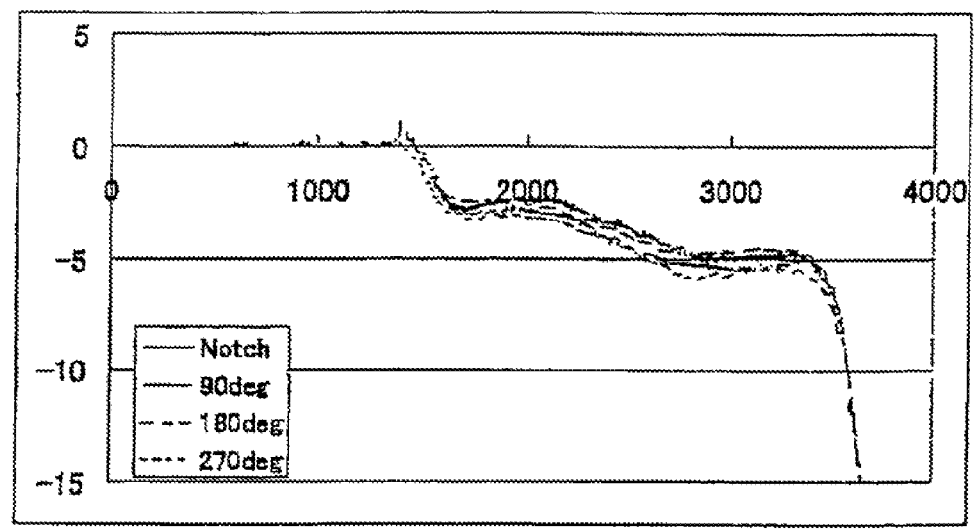
FIG. 4B is a graph showing the polishing amount of a device substrate at varying circumferential positions, as measured when the peripheral portion of the device substrate is polished while rotating the substrate at 100 rpm.
Figure 5:
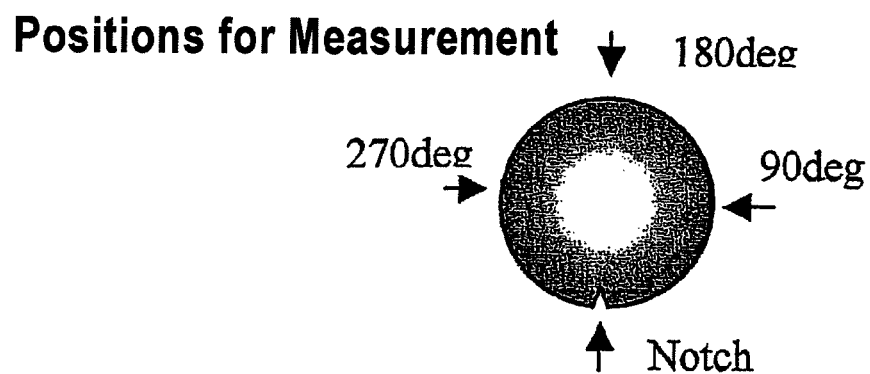
FIG. 5 is a diagram showing the varying positions for the measurement of polishing amount shown in FIGS. 4A and 4B.

FIG. 4A shows the polishing amount of the device substrate 14 at the peripheral positions shown in FIG. 5, i.e., the notch portion and the positions 90°, 180° and 270° counter-clockwise apart from the notch portion, as measured when the peripheral portion (about 4 mm width) of the device substrate 14 is polished while rotating the device substrate 14 at 700 rpm. FIG. 4B shows the polishing amount of the device substrate 14 at the peripheral positions shown in FIG. 5, i.e., the notch portion and the positions 90°, 180° and 270° counter-clockwise apart from the notch portion, as measured when the peripheral portion (about 4 mm width) of the device substrate 14 is polished while rotating the device substrate 14 at 100 rpm. As can be seen from FIGS. 4A and 4B, when the deposited film in the peripheral portion of the device substrate 14 is polished while rotating the device substrate 14 at 700 rpm, there is considerable variation in the polishing amount according to the peripheral positions due to variation in the thickness of the deposited film in the circumferential direction of the device substrate 14, whereas variation in the polishing amount is small when the deposited film in the peripheral portion of the device substrate 14 is polished while rotating the device substrate 14 at 100 rpm. The preferred range of the substrate rotational speed as verified by the data in FIGS. 3, 4A and 4B holds true for the deposited film 12 of this embodiment, consisting of the interconnects 18, the silicon layer 16, the nitride film (SiN film) 19 and the oxide film 20, because the hardness of each layer (especially the oxide film 20) is similar to that of an SiN film.

Figure 6:
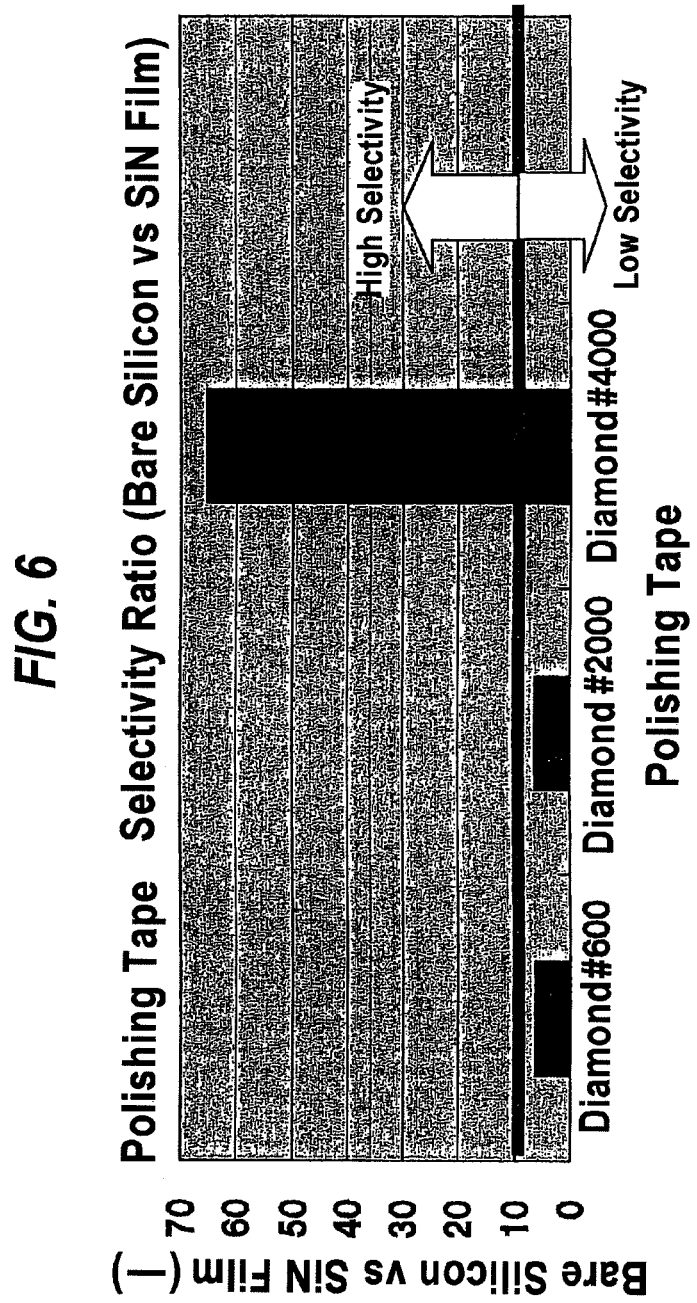
FIG. 6 is a graph showing the polishing rate ratio (selectivity ratio) between bare silicon and an SiN film in a silicon substrate, as measured when the silicon substrate is polished with various diamond tapes while rotating the silicon substrate at 100 rpm.

FIG. 6 shows the polishing rate ratio (selectivity ratio) between bare silicon and an SiN film in a silicon substrate, as measured when the silicon substrate is polished with various diamond tapes (polishing tapes 34) while rotating the substrate at 100 rpm in the polishing apparatus 30 shown in FIG. 2. As can be seen from FIG. 6, the selectivity ratio between bare silicon and an SiN film can be made not more than about 9 by the use of a diamond tape having #2000 or less diamond abrasive particles (particle size: not less than 9 μm). This indicates that a relatively small amount of silicon 10 will be polished upon removal of the deposited film 12. On the other hand, the selectivity ratio is significantly high when a diamond tape having #4000 diamond abrasive particles (particle size: 3 μm) is used. This indicates that upon complete removal of the deposited film 12, silicon 10 will be polished in a large amount at some locations along the circumferential direction of the device substrate. The data thus demonstrates that a diamond tape having #2000 or less diamond abrasive particles is suited for removal of a deposited film.

Figure 1C:
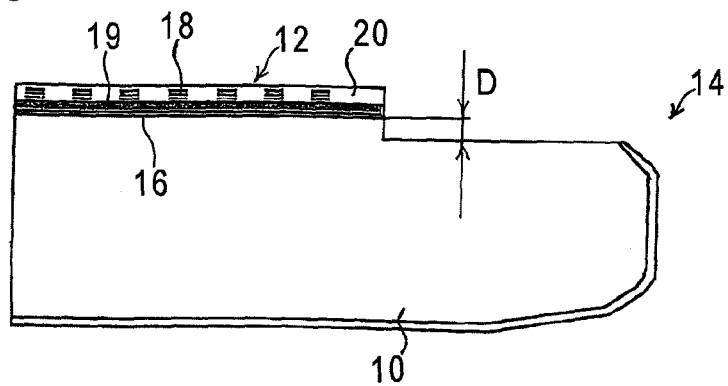
Figure 7:
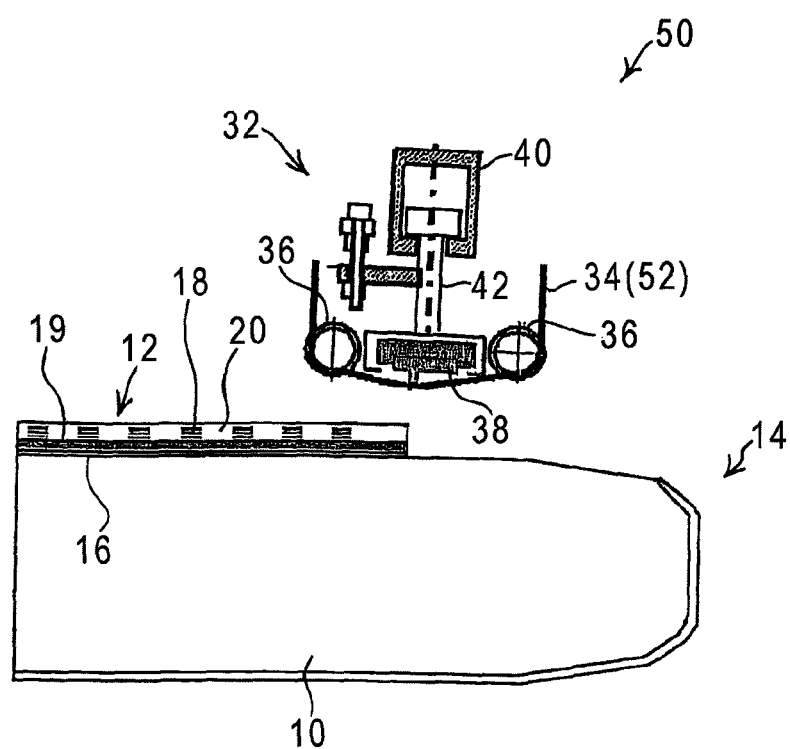
FIG. 7 is a diagram illustrating polishing of silicon of the device substrate, carried out according to the present invention.

Next, as shown in FIG. 1C, silicon 10, which has become exposed after the removal of the deposited film 12 lying in the peripheral portion of the device substrate 14, is polished to a predetermined grinding depth D, e.g., about 30 μm (D≈30 μm). The grinding depth D is, for example, 10 to 300 μm. Polishing (grinding) of silicon 10 is carried out, e.g., by using a polishing apparatus 50 as shown in FIG. 7. The polishing apparatus 50 differs from the polishing apparatus 30 shown in FIG. 2 in the use as the polishing tape 34 a diamond tape 52 having #4000-#20000 diamond abrasive particles (particle size: 3-0.2 μm). In the polishing apparatus 50 shown in FIG. 7, the same reference numerals are used for the same or like members as those of the polishing apparatus 30 shown in FIG. 2.

When polishing (grinding) the exposed silicon 10 after the removal of the deposited film 12 lying in the peripheral portion of the device substrate 14 by using the polishing apparatus 50, the polishing head 32 is moved to a position from which polishing is intended to be started while holding and rotating the device substrate 14 with the front surface (device surface) facing upwardly by the substrate holder. Then, while allowing the polishing tape 34 (diamond tape 52 having #4000-#20000 diamond abrasive particles) to travel at a constant speed, the pressing pad 38 is lowered to press the polishing tape 34 against the device substrate 14 at a set pressure, and the polishing head 32 is moved to the edge of the device substrate 14. In this manner, the polishing distance can be arbitrarily changed. The polishing operation is terminated when the silicon 10, lying in the peripheral portion of the device substrate 14, is polished to a predetermined grinding depth D, e.g., about 30 μm (D≈30 μm). During the polishing, the device substrate 14 may be kept in a wet environment, e.g., with pure water to protect the surface (device surface) of the device substrate 14 from dust.

The traveling speed of the polishing tape 34 during the polishing is, for example, 1 to 50 mm/min, and the pressure of the polishing tape 34 on the device substrate 14 is, for example, 5 to 20 N. The rotational speed of the device substrate 14 is not less than 500 rpm.

The polishing configuration in the polishing start portion can be controlled by keeping the polishing head 32 stationary in the early stage of polishing. A large area can be polished uniformly by moving the polishing head 34 at a constant speed toward the edge of the device substrate while polishing. When a particular peripheral portion is intended to be polished in a large amount, the movement of the polishing head 32 may be stopped at that position during its movement toward the edge of the device substrate 14. On the other hand, when a particular peripheral portion is intended to be polished in a small amount, the movement speed of the polishing head 32 may be changed at that position.

As described above, the rotational speed of the device substrate 14 is set at 100 to 400 rpm and a diamond tape having #2000 or less diamond abrasive particles is used as the polishing tape 34 in carrying out polishing (removal) of the deposited film 12. On the other hand, in carrying out polishing (grinding) of silicon 10, the rotational speed of the device substrate 14 is set not less than 500 rpm and a diamond tape having #4000-#20000 diamond abrasive particles is used as the polishing tape 34 for the following reasons:

As described above, when polishing of the device substrate 14 is carried out at a substrate rotational speed of not less than 500 rpm, e.g., 700 rpm, the polishing selectivity (difference in polishing rate between bare silicon and an SiN film) is high and the selectivity ratio between bare silicon and an SiN film can be, for example, about 30 (see FIG. 3). Such a high selectivity ratio, however, has no problem in carrying out polishing of bare silicon in the absence of the deposited film 12. Therefore, silicon 10 can be polished (ground) at a high rate by using the rotational speed of the device substrate 14 of not less than 500 rpm.

Similarly, when polishing of the device substrate 14 is carried out by using the diamond tape 52 having #4000-#20000 diamond abrasive particles, e.g., a diamond tape having #4000 diamond abrasive particles (particle size: 0.2 μm), the polishing selectivity for silicon is high and the selectivity ratio between bare silicon and an SiN film can be, for example, about 65 (see FIG. 6). Such a high selectivity ratio, however, has no problem in carrying out polishing of bare silicon in the absence of the deposited film 12. Thus, silicon 10 can be polished (ground) at a high rate by using the diamond tape 52 having #4000-#20000 diamond abrasive particles. In addition, such silicon polishing enables removal of a damaged or crushed layer from a surface being polished as well as control of the surface roughness of a polished surface.

When the outermost surface of the deposited film 12 is an oxide film, it is possible to first carry out polishing by using, instead of a diamond tape having diamond abrasive particles, a ceria tape having ceria abrasive particles, which has a higher selectively for the oxide film and can polish only the oxide film, until the oxide film is completely removed, and then carry out polishing of silicon using a diamond tape to polish away a certain amount of silicon. According to this method, the use of a ceria tape having no diamond abrasive particles instead of a diamond tape lowers the cost. Furthermore, the polishing amount can be more accurately controlled by first polishing only an oxide film with a ceria tape.

Figure 8A:
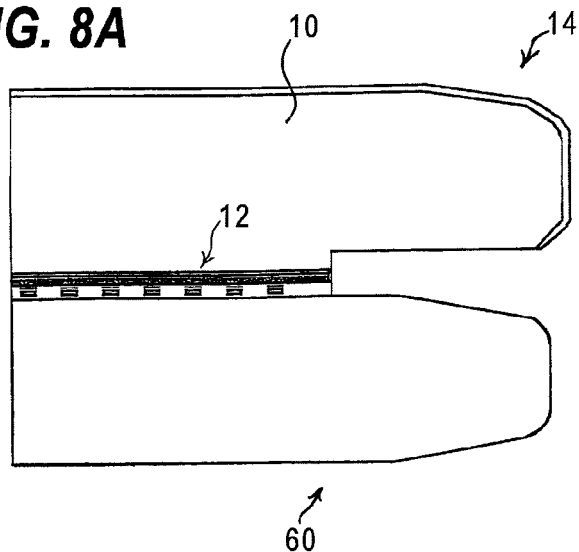
FIGS. 8A through 8C are diagrams illustrating the process according to the present invention, showing the process after the step of polishing silicon of the device substrate.
Figure 8B:
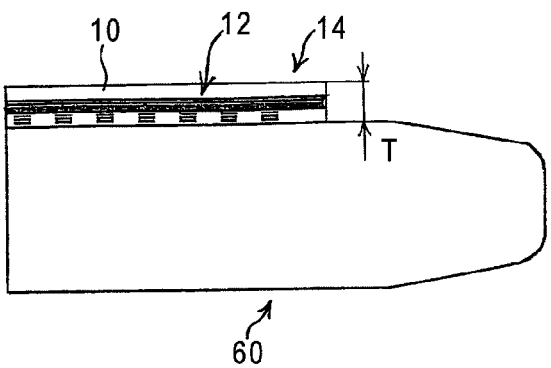

Next, as shown in FIG. 8A, a supporting substrate (silicon substrate) 60 is bonded to the front surface of the device substrate (silicon substrate) 14 by heat treatment or the like. Thereafter, as shown in FIG. 8B, silicon 10 on the back side of the device substrate 14 is ground away (back grinding) until the thickness of the device substrate 14 reaches a predetermined thickness T which is smaller than the above-described grinding depth D (T<D).

Figure 8C:
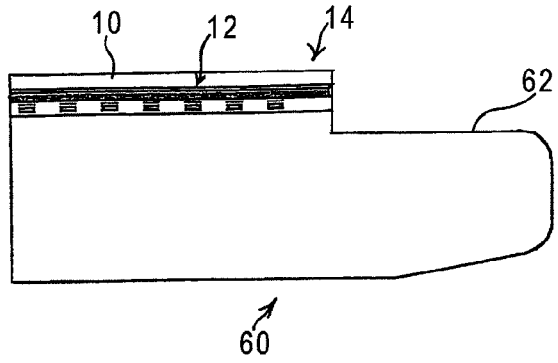

Next, in order to prevent the device substrate 14 from peeling off the supporting substrate 60 and breaking, as shown in FIG. 8C, the peripheral portion of the supporting substrate 60 is polished while polishing part of the peripheral end surface of the device substrate 14, thereby forming a chamfered portion 62 in the peripheral portion of the supporting substrate 60. The polishing for the formation of the chamfered portion 62 is carried out, e.g., by using the above-described polishing apparatus 50 shown in FIG. 7, which uses the diamond tape 52 having #4000-#20000 diamond abrasive particles (particle size: 3-0.2 μm) as the polishing tape 34, while rotating the bonded silicon substrates 14, 60, e.g., at a rotational speed of not less than 500 rpm. As described above, the high selectivity ratio between silicon and an SiN film due to such a high substrate rotational speed has no problem in polishing of only silicon, and the silicon of the supporting substrate 60 can be ground (polished) at a high rate. In addition, the silicon polishing enables removal of a damaged or crushed layer from a surface being polished as well as control of the surface roughness of a polished surface (chamfered portion).

After the formation of the chamfered portion 62 in the peripheral portion of the supporting substrate 60, finish polishing of the chamfered portion 62 is carried out, as necessary, by using the polishing apparatus 50 shown in FIG. 7 which uses, e.g., a ceria tape instead of the diamond tape 52 having #4000-#20000 diamond abrasive particles. The finish polishing polishes the surface of the chamfered portion 62 into a mirror-like surface with few polishing traces. The finish polishing can prevent a resist, for example, from remaining on the surface and adversely affecting a later process.

In the above-described embodiment, a peripheral portion, which is to become the below-described knife-shaped edge, of a device substrate is removed before bonding the device substrate to a supporting substrate (pre-trimming), and a chamfered portion is formed in the peripheral portion of the supporting substrate after bonding the two silicon substrates (post-trimming). It is also possible to polish (grind) silicon on the back side of a device substrate after bonding of two silicon substrates, thereby forming a knife-shaped edge, and to polish away the knife-shaped edge, followed by the formation of a chamfered portion in the peripheral portion of the supporting substrate (post-trimming). This embodiment, which involves only the post-trimming, will now be described.

First, as shown in FIG. 9A, the supporting substrate (silicon substrate) 60 is bonded to the surface of the device substrate (silicon substrate) 14 having the deposited film 12 formed on the surface of silicon 10. Next, as shown in FIG. 9B, silicon 10 on the back side of the device substrate 14 is ground away (back grinding) until the thickness of the device substrate 14 reaches a predetermined thickness, whereby an outwardly extending knife-shaped edge 14a, not bonded to the supporting substrate 60, is formed in the peripheral portion of the device substrate 14.

Figure 10:
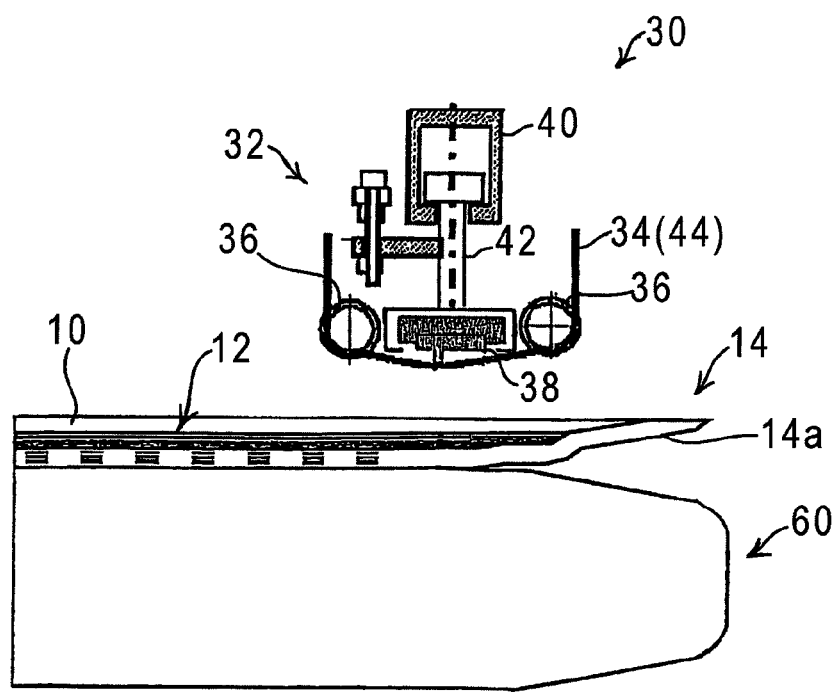
FIG. 10 is a diagram illustrating removal of a knife-shaped edge of a device substrate, carried out according to the present invention.

Next, as shown in FIG. 9C, the knife-shaped edge 14a formed in the peripheral portion of the device substrate 14 is removed. The removal of the knife-shaped edge 14a is carried out in a similar manner to that described above for the removal of the deposited film 12 lying in the peripheral portion of the device substrate 14, using the above-described polishing apparatus 30 shown in FIG. 2. In particular, as shown in FIG. 10, the polishing head 32 is moved to a position from which polishing is intended to be started while holding and rotating the bonded substrates 14, 60 with the device substrate 14 facing upwardly by the substrate holder. Then, while allowing the polishing tape 34 to travel at a constant speed, the pressing pad 38 is lowered to press the polishing tape 34 against the device substrate 14 at a set pressure, and the polishing head 32 is moved to the edge of the device substrate 14.

As in the preceding embodiment, the completion of polishing can be determined by using an end point detection system, mounted in the polishing apparatus 30 and having a measuring device which performs optical measurement (color discrimination with a CCD, laser light, white light), or measurement with microwaves, ultrasonic waves, alternating magnetic field signals, etc., or having a torque detector which detects the rotary torque of the substrate holder when it holds and rotates the bonded substrates.

The traveling speed of the polishing tape 34 during the polishing is, for example, 1 to 50 mm/min, and the pressure of the polishing tape 34 on the device substrate 14 is, for example, 5 to 20 N. The rotational speed of the device substrate 14 is 100 to 400 rpm. A diamond tape 44 having #2000 or less diamond abrasive particles (particle size: not less than 9 μm) is used as the polishing tape 34.

Next, as shown in FIG. 8C and as in the preceding embodiment, in order to prevent the device substrate 14 from peeling off the supporting substrate 60 and breaking, the peripheral portion of the supporting substrate 60 is polished while polishing part of the peripheral end surface of the device substrate 14, thereby forming a chamfered portion 62 in the peripheral portion of the supporting substrate 60. The polishing for the formation of the chamfered portion 62 is carried out, e.g., by using the above-described polishing apparatus 50 shown in FIG. 7, which uses the diamond tape 52 having #4000-#20000 diamond abrasive particles (particle size: 3-0.2 μm) as the polishing tape 34, while rotating the bonded silicon substrates 14, 60, e.g., at a rotational speed of not less than 500 rpm.

After the formation of the chamfered portion 62 in the peripheral portion of the supporting substrate 60, finish polishing of the chamfered portion 62 is carried out, as necessary, by using the polishing apparatus 50 shown in FIG. 7 which uses, e.g., a ceria tape instead of the diamond tape 52 having #4000-#20000 diamond abrasive particles. The finish polishing polishes the surface of the chamfered portion 62 into a mirror-like surface with few polishing traces.

When polishing a peripheral portion of a device substrate before bonding the device substrate to a supporting substrate, the polishing is carried out by using a coarse polishing tape.

The completion of polishing of pattern or an interconnect layer, including an oxide layer, can be determined by using an end point detection system which performs optical measurement (color discrimination with a CCD, laser light, white light), measurement with microwaves, ultrasonic waves, alternating magnetic field signals, etc., or monitoring of the rotary torque of the substrate holder when it holds and rotates a substrate.

While the present invention has been described with reference to preferred embodiments, it is understood that the present invention is not limited to the embodiments described above, but is capable of various changes and modifications within the scope of the inventive concept as expressed herein.

What is claimed is:

1. A method for manufacturing a semiconductor device comprising:
    pressing a first polishing tape against a peripheral portion of a device substrate having a deposited film on a silicon substrate while rotating the device substrate at a first rotational speed, thereby removing the deposited film lying in the peripheral portion of the device substrate and exposing the underlying silicon; and then
    pressing a second polishing tape against the exposed silicon lying in the peripheral portion of the device substrate while rotating the device substrate at a second rotational speed, the second rotational speed being different from the first rotational speed, thereby polishing the silicon substrate to a predetermined depth.

2. The method for manufacturing a semiconductor device according to claim 1, wherein the first rotational speed is 100 to 400 rpm, and the second rotational speed is not less than 500 rpm.

3. The method for manufacturing a semiconductor device according to claim 1, wherein the first polishing tape is a diamond tape having #2000 or less diamond abrasive particles or ceria tape having ceria abrasive particles, and the second polishing tape is a diamond tape having #4000-#20000 diamond abrasive particles.

4. The method for manufacturing a semiconductor device according to claim 1, further comprising:
    bonding a supporting substrate to the surface of the device substrate after polishing the silicon to a predetermined depth;
    grinding silicon on the back side of the device substrate until a predetermined thickness of the device substrate is reached; and then
    pressing a third polishing tape against a peripheral portion of the supporting substrate while rotating the bonded substrates at a third rotational speed, thereby polishing silicon, lying in the peripheral portion of the supporting substrate, to a predetermined depth to form a chamfered portion.

5. The method for manufacturing a semiconductor device according to claim 4, further comprising:
    pressing a fourth polishing tape against the chamfered portion formed in the peripheral portion of the supporting substrate while rotating the bonded substrates at a fourth rotational speed to carry out finish polishing of the chamfered portion.

6. The method for manufacturing a semiconductor device according to claim 1, wherein the second rotational speed is greater than the first rotational speed.

* * * * *